US006771371B2

(12) United States Patent
Sherwin

(10) Patent No.: US 6,771,371 B2
(45) Date of Patent: Aug. 3, 2004

(54) PARTICLE DETECTION AND REMOVAL APPARATUS FOR USE ON WAFER FABRICATION EQUIPMENT TO LOWER TOOL RELATED DEFECTS FROM PARTICLE CONTAMINATION

(75) Inventor: Lucius M. Sherwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 09/921,364

(22) Filed: Aug. 2, 2001

(65) Prior Publication Data

US 2002/0020837 A1 Feb. 21, 2002

Related U.S. Application Data

(60) Provisional application No. 60/224,434, filed on Aug. 10, 2000.

(51) Int. Cl.[7] ............... G01N 21/00; G01N 1/00; G01N 1/14; A47L 9/02; A47L 1/00
(52) U.S. Cl. ............... 356/337; 356/38; 15/421; 15/246.2; 73/864.35
(58) Field of Search ............... 356/337, 38; 15/421, 15/246.2; 73/864.35

(56) References Cited

U.S. PATENT DOCUMENTS

| 5,367,139 A | * 11/1994 | Bennett et al. |
| 5,542,146 A | * 8/1996 | Hoekstra et al. |
| 5,837,094 A | * 11/1998 | Tsukazaki et al. |

* cited by examiner

Primary Examiner—Frank G. Font
Assistant Examiner—Khaled Brown
(74) Attorney, Agent, or Firm—Jacqueline J. Garner; W. James Brady, III; Frederick J. Telecky, Jr.

(57) ABSTRACT

A portable particle detection and removal system (100) that connects to a house vacuum (200). A particle sensor (106) is connected between two hoses: one (102) connected to the house vacuum (200) and one (104) for vacuuming the wafer equipment chamber. A smaller diameter hose (104) may be used for vacuuming the wafer equipment chamber. The particle sensor detects (106) incoming particles and a particle count is displayed for the operator. A modulated cleaning system (112) modulates the vacuum pressure in the second hose (104) between two vacuum pressure states.

19 Claims, 2 Drawing Sheets

PARTICLE DETECTION AND REMOVAL APPARATUS FOR USE ON WAFER FABRICATION EQUIPMENT TO LOWER TOOL RELATED DEFECTS FROM PARTICLE CONTAMINATION

This application claims priority under 35 USC §119(e)(1) of provisional application No. 60/224,434 filed Aug. 11, 2002.

FIELD OF THE INVENTION

The invention is generally related to the field of semiconductor wafer fabrication equipment and more specifically to particle detection and removal in wafer fabrication equipment.

BACKGROUND OF THE INVENTION

During maintenance of wafer fabrication equipment, particles are left in and on the equipment chamber surfaces. These particles cause yield loss and higher baseline defects. The current tools used to remove particles are very ineffective and require a large amount to over cleaning to obtain less than ideal performance. Most wafer fabrication facilities use only a house vacuum or portable hepa filter vacuum with reducers to vacuum wafer chamber areas.

House vacuums are typically used to remove particle contamination. They are good at removing heavy contamination and do not use make up air that can spread contamination. Unfortunately, they cannot be calibrated and are very slow at removing particles from recesses like vented screws.

SUMMARY OF THE INVENTION

The invention is a portable particle detection and removal system that connects to a vacuum source. A particle sensor is connected between the vacuum source and a sample port. The sample port has a smaller diameter and may be used for vacuuming the wafer equipment chamber. The particle sensor detects incoming particles and a particle count is displayed for the operator.

In one embodiment, a modulated cleaning system modulates the vacuum pressure between two vacuum pressure states. For example, a Venturi Boost may be used to provide a greater vacuum state than the vacuum source. The static vacuum pressure of the vacuum source is 5" of water. When the venturi boost is turned on the vacuum pressure increases to 10" of water. Modulating between two vacuum pressure states increases the ability to remove particles and the speed at which the particles are removed.

An advantage of the invention is providing a particle detection and removal system that provides feedback to the user and allows faster and more complete removal of contamination especially from small areas.

This and other advantages will be apparent to those of ordinary skill in the art having reference to the specification in conjunction with the drawings.

DETAILED DESCRIPTION OF THE EMBODIMENTS

Figure 1:
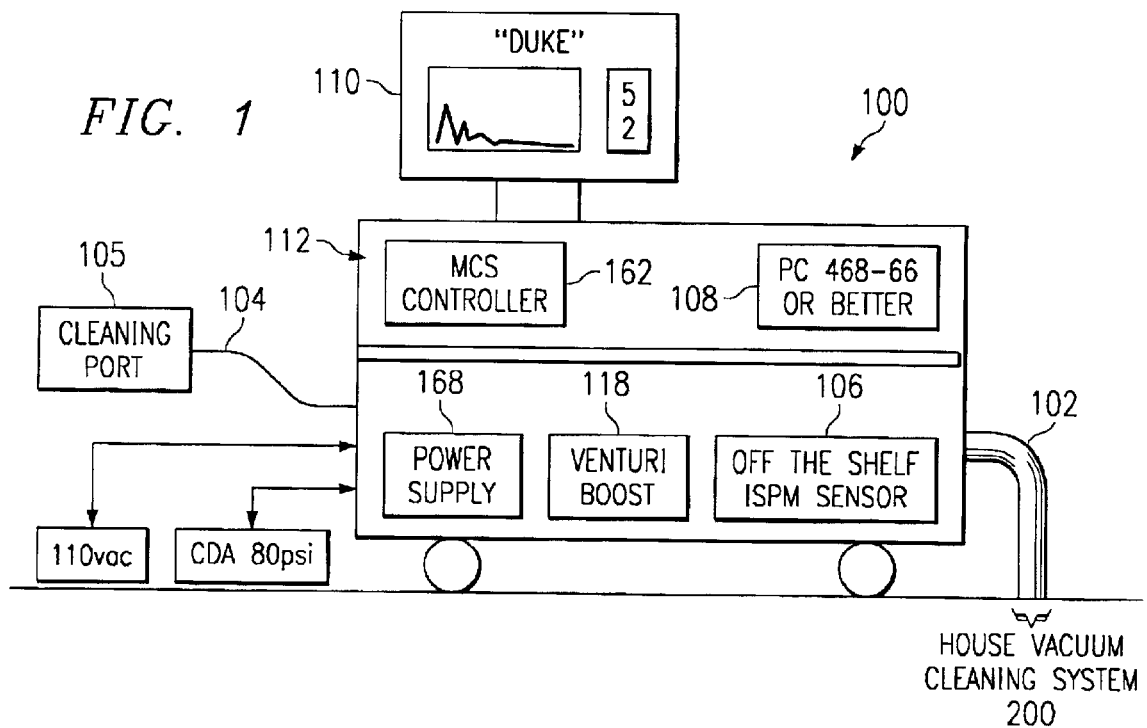
FIG. 1 is a block diagram of the particle detection and removal system according to an embodiment of the invention.

A portable particle detection and removal system 100 according to an embodiment of the invention is shown in FIG. 1. System 100 is used with semiconductor wafer fabrication equipment to efficiently and effectively remove particles from process chambers of the fabrication equipment. System 100 includes two hoses. A first hose 102 connects to a vacuum source 200. Vacuum source 200 may comprise, for example, a house vacuum or portable hepa filter vacuum. Wafer fabrication facilities typically include a house vacuum cleaning system. These systems typically use a large outside debris collection tank. The vacuum is produced by a squirrel cage fan. This connects to a distribution piping system that leads to multiple ports in a clean room. It pulls 5" of water in the main lines and 3–4" at the ports in the clean room.

The second hose 104 provides a cleaning/sample port 105 for insertion into the area to be vacuumed, i.e., the process chambers of the wafer fabrication equipment. Second hose 104 preferably has a smaller diameter than the first hose 102 in order to provide access to smaller areas. In the preferred embodiment, the outside diameter is ½ inch.

Particle sensor 106 is used to detect the number of particles vacuumed from the process chamber. Particle sensor 106 is placed between first hose 102 and second hose 104. Adapters (not shown) for adapting between the first hose 102 diameter and one sensor port (exit) and between another sensor port (entrance) and the second hose 104.

Sensor 106 may be an of the shelf ISPM (In Situ Particle Monitor). In the preferred embodiment, a HYT sensor Model # 70-40/40 NF from Pacific Scientific Instruments is used. The HYT sensor includes a laser, detector, pre-amplifier, and K40/K40 body (port size of 40 mm), beam stop and software. The sample airflow is passed through a laser beam's path. If a particle hits the beam, laser scattered light is produced and detected by a photo diode 90° to the side of the beam. A controller counts and sizes the particle. The count is sent from the IPSM to a computing device 108.

The sensor software may be loaded onto a computing device 108. As shown in FIG. 1, computing device 108 may be a personal computer (PC). The PC should contain a 486-66 processor or better. Other computing devices, such as those including specially programmed micro-controllers, digital signal processors (DSPs), or other microprocessors, will be apparent to those of ordinary skill in the art having reference to the specification.

Computing device 108 receives particle count information from sensor 106 and displays a representation of the particle count to a user. For example, the actual particle count may be displayed on a computer monitor 110. Additionally, the unit may emit an audible tone. The frequency of the tone varies as the particle count increases. The particle count is given for a set period of time. For example, is the sample time is set at 2 seconds, the user may receive new particle count information approximately every 2 seconds.

A modulated cleaning system (MCS) 112 may be included for modulating the vacuum pressure in hose 104 between at least two pressure states. The MCS 112 is optional, but it provides for faster and deeper cleaning. It is very useful for cleaning deep into cracks and recesses like screw holes.

Hose 104 is connected through hose 102 to the vacuum source 200, which provides a first pressure state. This is typically a fixed vacuum state. A Venturi Boost 114 may be connected to MCS 112 and hose 104 to provide a second, greater vacuum pressure state. A venturi boost is a small piece of pipe with a CDA (Clean Dry Air) input on the side. As the CDA flows in from the side, the air down the pipe starts moving into the device from the low pressure created at the nozzle. The sample air is less than the total air at the exhaust (sample+CDA). The pressure is set by adjusting the CDA line pressure regulator. Alternatively, both pressure states could be provided by the venturi boost by having two compressed air supplies (CDAs) at different pressures. However, the exhaust would still need to be removed or filtered from the clean room. Amplitude modulation for the vacuum is produced by switching between normal house vacuum and the greater vacuum of the Venturi Boost. This keeps particles always moving into system 100 and increases the ability (and speed) to remove particles from blind holes like cracks and crevices.

The user may select the speed of switching between the vacuum states and the ratio of high vacuum to low vacuum (duty cycle). In the preferred embodiment, 1 to 10 cycles per second are used. The MCS 112 is used to set the speed and duty cycle.

Figure 2:
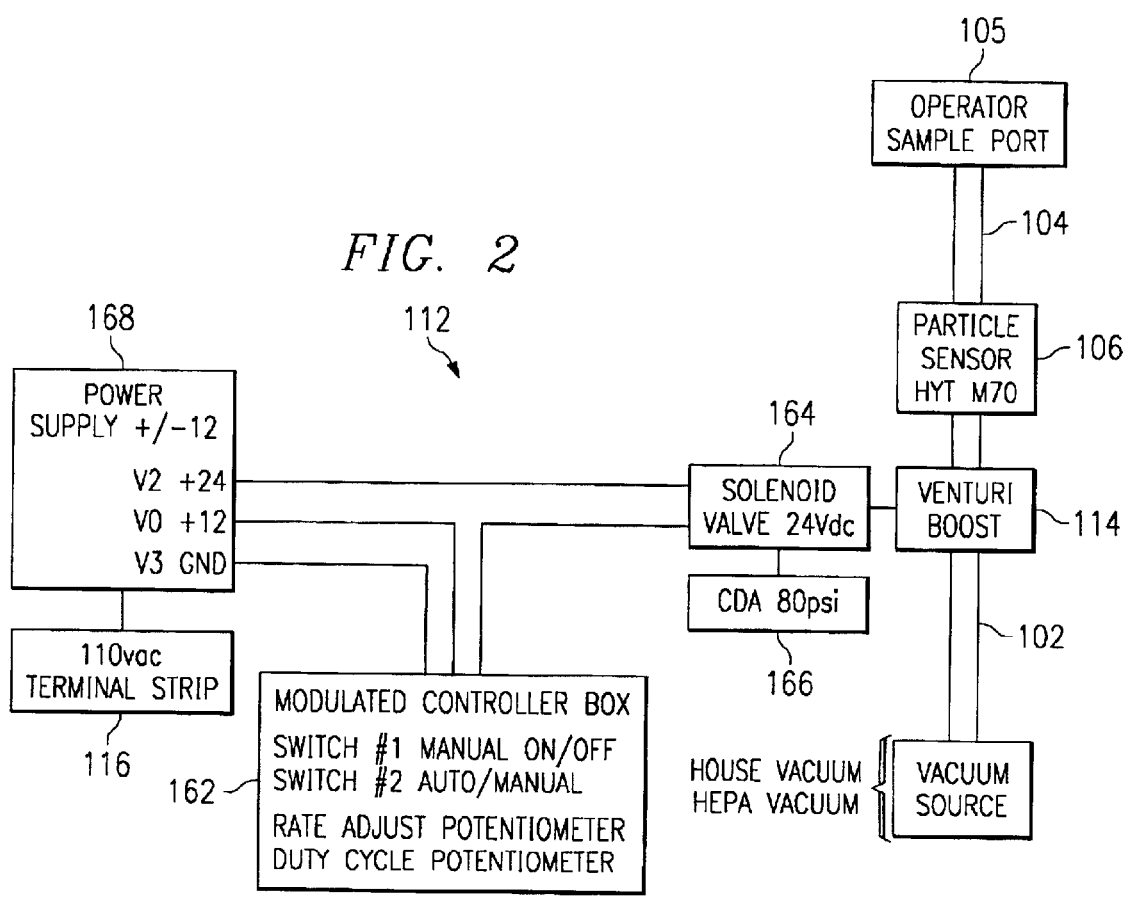
FIG. 2 is a block diagram of a modulated cleaning system for use in the system of FIG. 1.

A layout of a preferred embodiment MCS system 112 is shown in FIG. 2. MCS system 112 comprises a controller box 162, power supply 168, solenoid valve 164, CDA (clean dry air) 166, and venturi boost 114. Power supply 168 provides ground GND and +12V to the controller box 162. Power supply 168 also provides +24V to the solenoid valve 164. The CDA 166 is connected to the venturi boost 114 through solenoid valve 164. CDA 166 provides compressed air at a given pressure. In the preferred embodiment the pressure is 80 psi.

Figure 3:
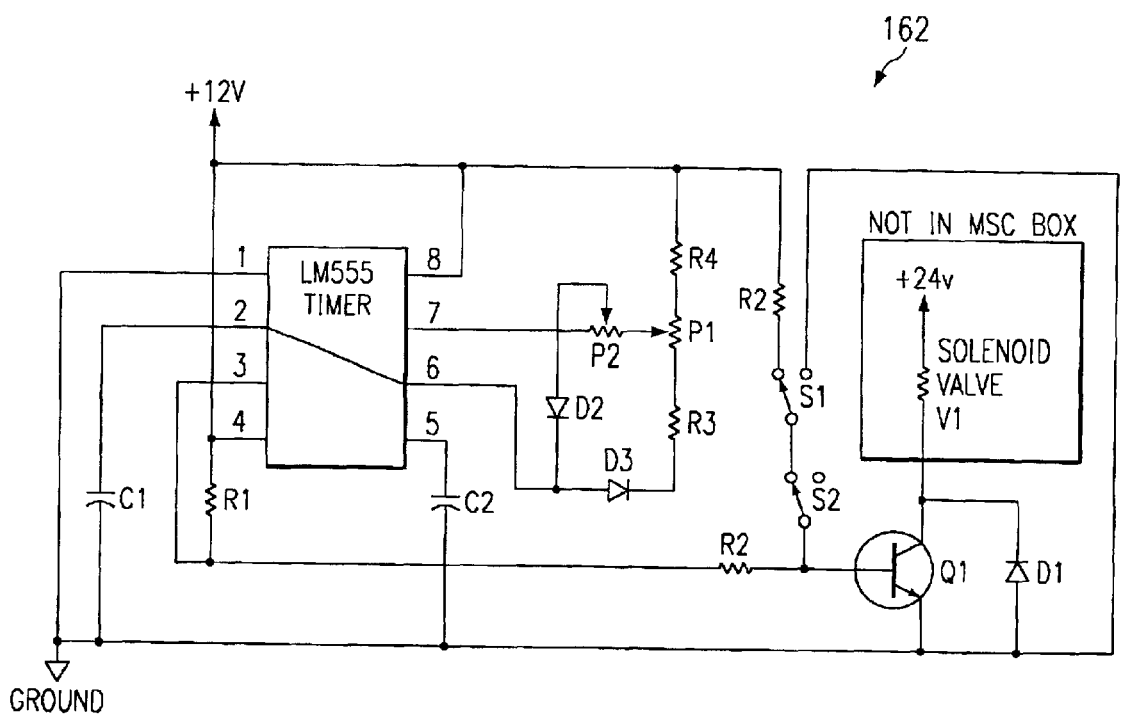
FIG. 3 is a schematic diagram of a modulated controller box for use in the system of FIG. 2.

A schematic diagram of the controller box 162 is shown in FIG. 3. The controller box 162 comprises a first switch S1 for a manual on/off and a second switch S2 for selecting automatic of manual operation. It also comprises a rate adjust potentiometer P1 and a duty cycle potentiometer P2.

A power strip plug 116 may be connected to 110-vac. Power strip plug 116 supplies power to the other components of system 100.

For portability, the components of system 100 may be placed on a cart 118. Cart 118 may be moved from one piece of equipment to another within a clean room environment. System 100 may be used to effectively and efficiently clean most semiconductor equipment (e.g., plasma etch chambers, thin film deposition chambers, etc.). After an equipment chamber has been worked on (e.g., maintenance work, repair work, etc.), system 100 may be used to locate and remove particle contamination that is invariably left behind.

Any dry surface that may have particles that could cause yield loss can be tested and cleaned at the same time. The location of any contamination can easily be determined because sensor 106 is continuously measuring the particle count and relaying this information through computing device 108 and monitor 110 to the user. Feedback to the user can be given every 2 seconds if desired. Since particle detection and removal occurs simultaneously, that user can quickly determine when a particular area meets or exceeds the expected particle level and move on to the next area. This is an advantage over quality control type tools used only to check how clean a surface is. System 100 has advantages over a standard house vacuum in that system 100 can be calibrated, removes contamination more quickly, offers fast cleaning of blind holes, and perhaps most importantly, provides immediate feedback to the user.

System 100 may be used as part of a main chamber clean procedure. For example, after wiping a chamber surface with a clean wipe and deionized water and a clean wipe and methanol, the chamber surface, including any screw holes, crevices, etc., may be vacuumed using system 100. The end of hose 104 is inserted into the chamber. MCS 108 modulates the pressure in hose 104 to remove particles from the chamber. As the particles move from hose 104 through sensor 106, sensor 106 detects the number of particles passing through in a given time (e.g., 2 seconds) and transmits the information to computing device 110. The particle count is displayed on monitor 112 for the user. The particles then continue from sensor 106 through hose 102 to the house vacuum system 200. Vacuuming continues until the particle count reads under a desired level in all locations. The expected or desired particle count may vary from equipment to equipment. As an example, the desired particle count for an etcher may be on the order of 20 particles per 2 second sample.

Vacuuming will typically occur in multiple stages. For example, various chamber parts (e.g., electrodes, focus rings, screws, etc.) may be removed, maintained, repaired, and/or replaced. Vacuuming to at or below the desired particle count may occur as each part or group of parts are placed back in the chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A particle detection and removal system for wafer fabrication equipment, comprising:
    a sample port for insertion in said wafer fabrication equipment;
    a vacuum source having a vacuum port, wherein a diameter of said sample port is smaller than a diameter of said vacuum port; and
    a particle sensor connected between said vacuum source and said sample port, said particle sensor for detecting a number of particles.

2. The system of claim 1, further comprising a modulated cleaning system for modulating a vacuum pressure between a first pressure state and a second pressure state.

3. The system of claim 2, wherein said first pressure state is provided by said vacuum source and the second pressure state is provided by a venturi boost.

4. The system of claim 1, wherein said vacuum source comprises a house vacuum.

5. The system of claim 1, wherein said vacuum source comprises a portable hepa filter vacuum.

6. The system of claim 1, further comprising a computing device connected to said particle monitor for displaying a count of particles detected by said particle monitor.

7. The system of claim 1, wherein said computing device is a personal computer and monitor.

8. A particle detection and removal system for wafer fabrication equipment, comprising:
    a portable cart;
    a first vacuum hose for connection to a vacuum source;
    a second, smaller diameter, vacuum hose having a cleaning port for connection to the wafer fabrication equipment;
    a particle sensor for detecting a number of particles connected between said first vacuum hose and said second vacuum hose; and a display mechanism connected to said particle sensor for repeatedly displaying the number of particles detected.

9. The system of claim 8, wherein said second vacuum hose has an outside diameter on the order of ½ inch.

10. The system of claim 8, further comprising a modulated cleaning system for modulating a vacuum pressure in said second hose between a first pressure state and a second pressure state.

11. The system of claim 10, wherein said first pressure state is provided by said vacuum source.

12. The system of claim 8, wherein said display mechanism is a computer and monitor.

13. The system of claim 8, wherein said vacuum source comprises a house vacuum.

14. The system of claim 8, wherein said vacuum source comprises a portable hepa filter vacuum.

15. A portable particle detection and removal systems for cleaning a process chamber of wafer fabrication equipment comprising:
- a sample port for insertion into said process chamber;
- a vacuum source having a vacuum port, wherein a diameter of said sample port is smaller than a diameter of said vacuum port; and
- a particle sensor connected between said vacuum source and said sample port, said particle sensor for detecting a number of particles.

16. The system of claim 15, further comprising a modulated cleaning system for modulating a vacuum pressure between a first pressure state and a second pressure state.

17. A particle detection and removal system for wafer fabrication equipment, comprising:
- a sample port for insertion in said wafer fabrication equipment;
- a vacuum source having a vacuum port, wherein a diameter of said sample port is smaller than a diameter of said vacuum port;
- a particle sensor connected between said vacuum source and said sample port, said particle sensor for detecting a number of particles; and
- a modulated cleaning system for modulating a vacuum pressure between a first pressure state and a second pressure state, wherein said modulated cleaning system comprises:
  - a venturi boost connected between said vacuum source and said particle sensor for providing said second pressure state;
  - a first clean dry air (CDA) line;
  - a solenoid connected between said CDA line and said venturi boost;
  - a controller box connected to said solenoid for controlling a modulation rate and duty cycle.

18. A particle detection and removal system for wafer fabrication equipment, comprising:
- a portable cart;
- a first vacuum hose for connection to a vacuum source;
- a second, smaller diameter, vacuum hose having a cleaning port for connection to the wafer fabrication equipment;
- a particle sensor for detecting a number of particles connected between said first vacuum hose and said second vacuum hose;
- a display mechanism connected to said particle sensor for repeatedly displaying the number of particles detected; and
- a modulated cleaning system for modulating a vacuum pressure in said second hose between a first pressure state and a second pressure state, wherein said modulated cleaning system comprises:
  - a venturi boost connected to said first vacuum hose for providing said second pressure state;
  - a first clean dry air (CDA) line;
  - a solenoid connected between said CDA line and said venturi boost; and
  - a controller box connected to said solenoid for controlling a modulation rate and duty cycle.

19. The system of claim 18, further comprising a second CDA line, wherein said venturi boost provides both said first pressure state and said second pressure state.

* * * * *